United States Patent [19]
Lo

[11] Patent Number: 6,118,661
[45] Date of Patent: Sep. 12, 2000

[54] CLIP FOR RETAINING A HEAT SINK ON A CHIP

[75] Inventor: Wei-Ta Lo, Tu-Chen, Taiwan

[73] Assignee: Foxconn Precision Components Co., Ltd., Taipei Hsien, Taiwan

[21] Appl. No.: 09/421,457

[22] Filed: Oct. 19, 1999

[30] Foreign Application Priority Data

Jul. 2, 1999 [TW] Taiwan ................................ 88211065

[51] Int. Cl.$^7$ ..................................................... H05K 7/20
[52] U.S. Cl. .......................... 361/704; 361/704; 361/707; 257/718; 257/719; 165/80.2; 165/80.3; 174/16.3; 24/625; 248/505
[58] Field of Search .................................. 361/704, 707, 361/709, 710, 717–719; 24/625; 257/718, 719, 726, 727; 174/16.3; 165/80.2, 80.3; 248/505

[56] References Cited

U.S. PATENT DOCUMENTS

| | | | |
|---|---|---|---|
| 5,486,981 | 1/1996 | Blomquist | 361/704 |
| 5,600,540 | 2/1997 | Blomquist | 361/704 |
| 5,602,719 | 2/1997 | Kinion | 361/704 |
| 5,933,325 | 8/1999 | Hou | 361/704 |
| 5,933,326 | 8/1999 | Lee et al. | 361/704 |
| 5,953,212 | 9/1999 | Lee | 361/709 |

*Primary Examiner*—Leo P. Picard
*Assistant Examiner*—Boris A. Chervinsky
*Attorney, Agent, or Firm*—We Te Chung

[57] ABSTRACT

A clip is configured for retaining a heat sink on a chip and socket combination. The clip includes an arcuate pressing portion, first and second engaging arms downwardly extending from opposite ends of the arcuate pressing portion, and a driving arm generally upwardly extending from a lower end of the second engaging arm. The clip engages with the socket by openings in the first and second engaging arms receiving projections on opposite edges of the socket. The arcuate pressing portion downwardly presses the heat sink toward the chip. The second engaging arm defines a slit above the hole thereof to reduce the rigidity thereof and the driving arm forms a rib to increase the rigidity thereof, thereby the driving arm having a greater rigidity than the second engaging arm. The driving arm is downwardly and outwardly movable to disengage the second engaging arm from the socket.

17 Claims, 5 Drawing Sheets

CLIP FOR RETAINING A HEAT SINK ON A CHIP

BACKGROUND OF THE INVENTION

The present invention relates to a clip for retaining a heat sink on a chip mounted on a socket wherein the clip includes a engaging arm and a driving arm connected with the engaging arm, the driving arm being more rigid than the engaging arm and being horizontally movable to disengage the engaging arm from the socket.

DESCRIPTION OF THE PRIOR ART

Larger chips of a computer produce a great deal of heat when transmitting electronic signals. If the heat is not dissipated efficiently, it will damage the chip. Heat sinks mounted on chips are now commonly used to dissipate heat therefrom. Conveniently securing/releasing the heat sink to/from the chip is a developing technology. U.S. Pat. No. 5,602,719 and Taiwan Patent Application No. 83217100 disclose two different conventional clips for this purpose.

Referring to FIG. 4, a first conventional clip 1 comprises an arcuate pressing portion 2 and a pair of engaging arms 3 downwardly extending from opposite ends of the arcuate pressing portion 2. Each engaging arm 3 defines a pair of holes 4 and 5, wherein the holes 4 are used for engaging with projections of a socket (not shown). When disengaging the clip 1 from the socket, an external tool, such as a screwdriver (not shown), is extended into one of the holes 5 and exerts a pivotal force on the corresponding arm 3 to release the engagement between the corresponding hole 4 and the projection of the socket. The disengaging operation is inconvenient as it needs a tool.

Referring to FIG. 5, a second conventional clip 10 comprises an arcuate pressing portion 11 and a pair of engaging arms 13 and 14 disposed on opposite ends of the arcuate pressing portion 11. The engaging arms 13 and 14 respectively define holes 15 and 16 proximate free ends thereof. The second conventional clip 10 further forms an operation portion 12 generally horizontally extending from one of the ends of the arcuate pressing portion 11 for disengaging the engaging arm 13 from a socket. In operation, an external force is exerted on the operation portion 12 to first downwardly push the engaging arm 13, and then to rotate the engaging arm 13 to disengaging the hole 15 from the socket. This operation is difficult. Hence, an improved clip is required to overcome the disadvantages of the prior art.

BRIEF SUMMARY OF THE INVENTION

A first object of the present invention is to provide a clip which is easy to disengage from a socket;

A second object of the present invention is to provide an electronic component assembly comprising a chip and socket combination, a heat sink mounted on the chip, and a clip for retaining the heat sink on the chip, wherein the clip is easy to manipulate to disengage from the socket.

To achieve the above objects, a clip of the present invention includes an arcuate pressing portion, a first engaging arm and a second engaging arm downwardly extending from opposite ends of the arcuate pressing portion, and a driving arm generally upwardly extending from a lower end of the second engaging arm. The arcuate pressing portion is received in a channel of the heat sink and exerts a downward force against the heat sink. The first and second engaging arms each form a hole for engaging with corresponding projections of the socket. The second engaging arm defines a slit above the hole thereof for increasing pliancy of the second engaging arm. The driving arm forms a rib in a lengthwise direction thereof for increased rigidity thereof. Thus, the driving arm is more rigidity than the second engaging arm, thereby the driving arm being horizontally movable to disengage the second engaging arm from the socket.

Other objects, advantages and novel features of the invention will become more apparent from the following detailed description of the present embodiment when taken in conjunction with the accompanying drawings.

DETAILED DESCRIPTION OF THE INVENTION

Figure 1:
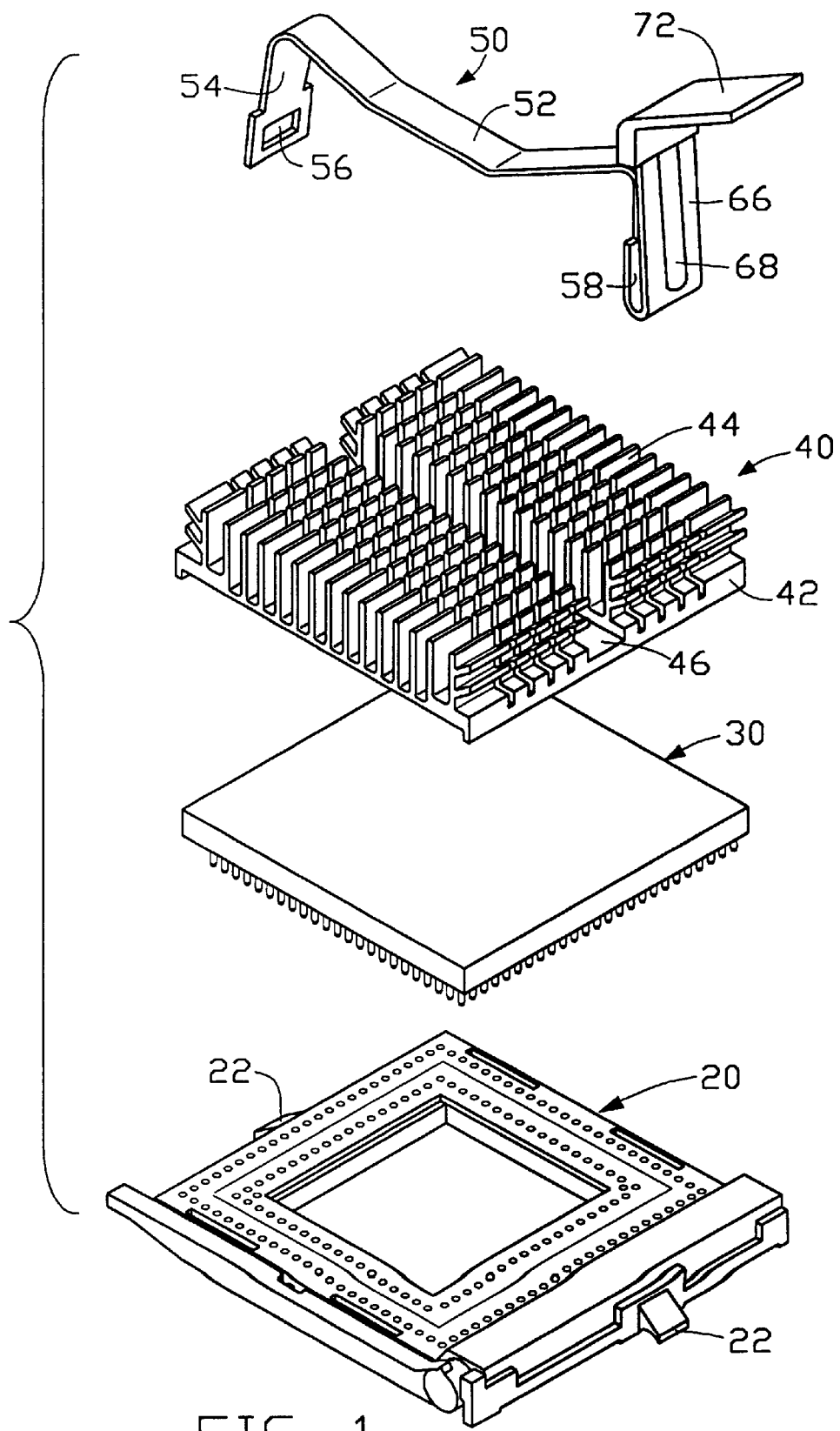
FIG. 1 is an exploded view of an electronic component assembly including a clip in accordance with the present invention.
Figure 2:
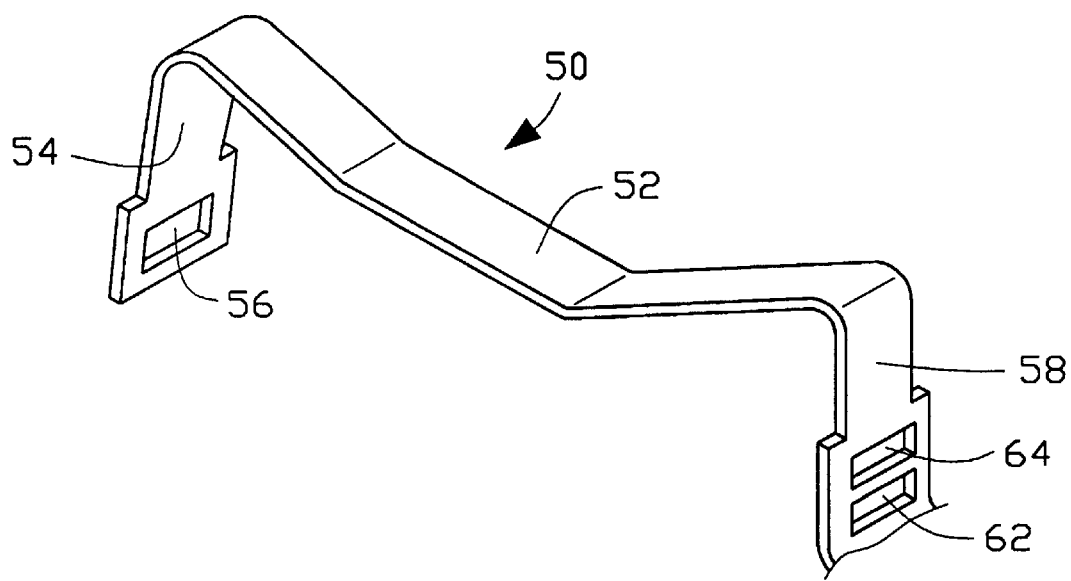
FIG. 2 is a partial perspective view of the clip of FIG. 1.

Referring to FIGS. 1 and 2, a clip 50 of the present invention is configured for retaining a heat sink 40 on a combination of a chip 30 and a socket 20. The socket 20 forms a pair of projections 22 on opposite edges thereof. The heat sink 40 comprises a base portion 42 and a plurality of fins 44 upwardly extending from a top face of the base 42 for more efficient heat dissipation. The heat sink 40 defines a channel 46 in the top face of the base 42.

The clip 50 is made of resilient metal, for example, steel or copper. The clip 50 includes an arcuate pressing portion 52, a first engaging arm 54 and a second engaging arm 58 downwardly extending from opposite ends of the arcuate pressing portion 52, a driving arm 66 generally upwardly extending from a lower end of the second engaging arm 58 and an L-shaped tail portion 72 positioned at an upper end of the driving arm 66. The first and second engaging arms 54 and 58 form engaging mechanisms for engaging with corresponding projections 22 of the socket 20. In a preferred embodiment of the present invention, the engaging mechanism includes holes 56, 62 in the engaging arms 54, 58, respectively. It can be understood by those skilled in the art, other form of engaging mechanism, such as hooks, can be used to replace the holes 56, 62. The second engaging arm 58 defines a slit 64 above the hole 62 thereof to add flexibility of the second engaging arm 58. The driving arm 66 forms a rib 68 in a lengthwise direction thereof to increase the rigidity thereof. Therefore, the driving arm 66 has a greater rigidity than the second engaging arm 58. In a preferred embodiment of the present invention, the tail portion 72 is unitarily stamped and formed with the driving arm 66. An alternate embodiment of the present invention features the tail portion 72 made of a plastic material which is over-molded to the upper end of the driving arm 66. A second alternate embodiment of the present invention features the tail portion 72 made of a plastic material which interferentially engages to the upper end of the driving arm 66.

Figure 3:
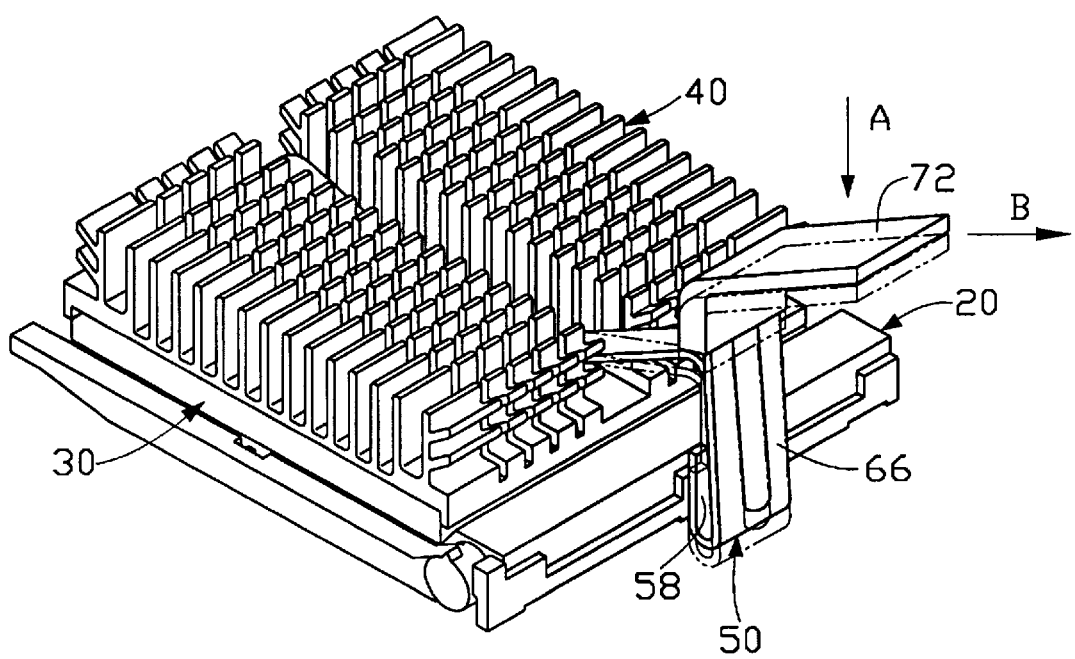
FIG. 3 is a perspective view of the assembled electronic component assembly of FIG. 1.
Figure 4:
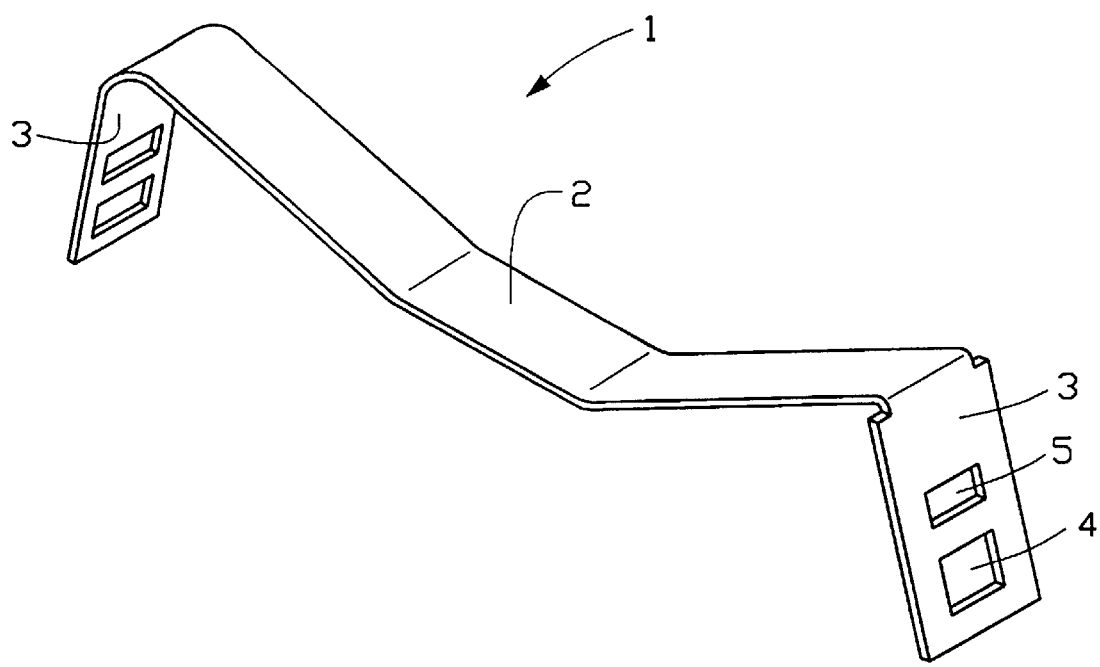
FIG. 4 is a perspective view of a first conventional clip.
Figure 5:
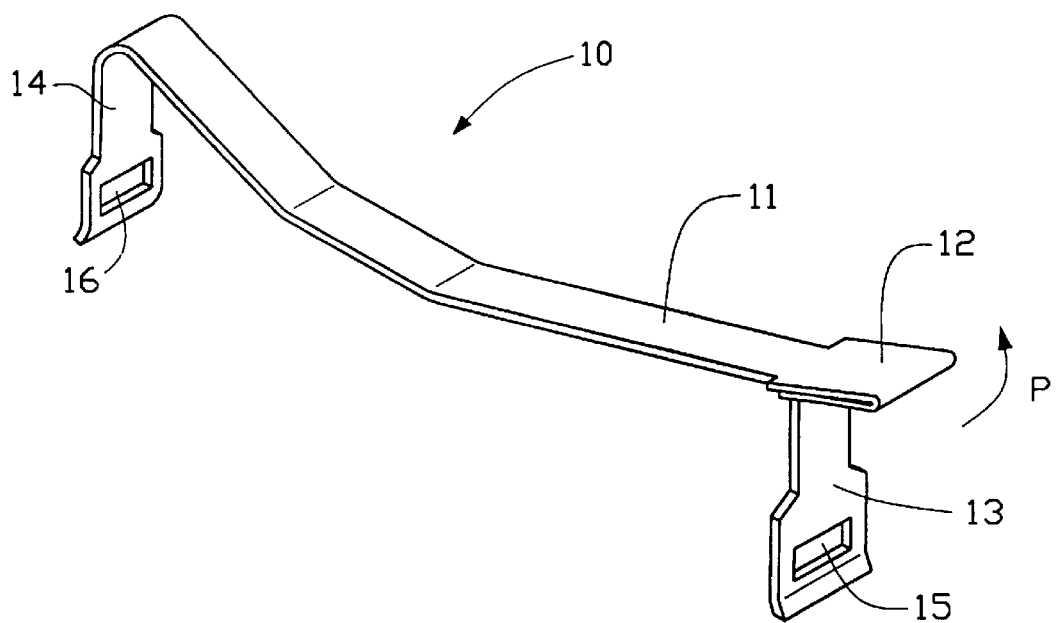
FIG. 5 is a perspective view of a second conventional clip.

Also referring to FIG. 3, in operation, the holes 56 and 62 of the first and second engaging arms 54 and 58 engage with corresponding projections 22 of the socket 20, and the arcuate pressing portion 52 is received in the channel 46 of the base 42 and presses the heat sink 40 toward the chip 30. To disengage the clip 50 from the socket 20, an external force is firstly exerted on the tail portion 72 in a direction indicated by arrow A to downwardly move the driving arm 66 and the second engaging arm 58; then the force is exerted in a direction indicated by arrow B which outwardly drags the lower end of the second engaging arm 58 in a horizontal direction, thereby disengaging the hole 62 from the projection 22 to complete the disengagement between the clip 50 from the socket 20. This disengagement operation is more convenient than the prior arts.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A clip for retaining a heat sink on a chip and socket combination, comprising:
    an arcuate pressing portion adapted for pressing a heat sink against a top of a chip;
    a first engaging arm and a second engaging arm downwardly extending from opposite ends of the pressing portion, the first and second engaging arms each forming an engaging mechanism adapted for engaging with a socket; and
    a driving arm generally upwardly extending from a lower end of the second engaging arm, the driving arm having a greater rigidity than the second engaging arm, the driving arm being downwardly and outwardly movable to disengage the second engaging arm from the socket.

2. The clip as claimed in claim 1, wherein the engaging mechanisms of the first and second engaging arms are through holes.

3. The clip as claimed in claim 1, wherein the second engaging arm defines a slit above the engaging mechanism thereof for reducing a rigidity of the second engaging arm.

4. The clip as claimed in claim 1, wherein the driving arm forms a rib in a lengthwise direction thereof to increase the rigidity thereof.

5. The clip as claimed in claim 1, further comprising a tail portion positioned at an upper end of the driving arm.

6. The clip as claimed in claim 5, wherein the tail portion is unitarily stamped and formed with the driving arm.

7. The clip as claimed in claim 5, wherein the tail portion is made of plastic material and is over-molded to the upper end of the driving arm.

8. The clip as claimed in claim 5, wherein the tail portion is made of plastic material and interferentially engages with the upper end of the driving arm.

9. An electronic component assembly comprising:
    a chip and socket combination, the socket forming a pair of projections on opposite edges thereof;
    a heat sink mounted on the chip, the heat sink defining a channel; and
    a clip for retaining the heat sink on the chip, the clip including an arcuate pressing portion, a first engaging arm and a second engaging arm downwardly extending from opposite ends of the arcuate pressing portion, and a driving arm generally upwardly extending from a lower end of the second engaging arm, the arcuate pressing portion being received in the channel of the heat sink and downwardly pressing the heat sink toward the chip, the first and second engaging arms each being formed with an engaging mechanism engaging corresponding projections of the socket, the driving arm having a greater rigidity than the second engaging arm, the driving arm being downwardly and outwardly movable to disengage the second engaging arm from the socket.

10. The electronic component assembly as claimed in claim 9, wherein the engaging mechanisms of the first and second engaging arms are through holes.

11. The electronic component assembly as claimed in claim 9, wherein the second engaging arm defines a slit above the engaging mechanism thereof to reduce the rigidity thereof.

12. The electronic component assembly as claimed in claim 9, wherein the driving arm forms a rib in a lengthwise direction thereof to increase the rigidity thereof.

13. The electronic component assembly as claimed in claim 9, wherein the clip further comprises a tail portion positioned at an upper end of the driving arm.

14. The electronic component assembly as claimed in claim 13, wherein the tail portion is unitarily stamped and formed with the driving arm.

15. The electronic component assembly as claimed in claim 13, wherein the tail portion is made of plastic material and is over-molded to the upper end of the driving arm.

16. The electronic component assembly as claimed in claim 13, wherein the tail portion is made of plastic material and interferentially engages with the upper end of the driving arm.

17. A method of assembling/disassembling a heat sink to/from a socket, comprising the steps of:
    providing a socket with a pair of projections on two opposite edges thereof;
    seating a chip onto the socket;
    positioning a heat sink atop the chip, said heat sink defining a channel;
    providing a clip with an arcuate pressing portion and first and second engaging arms downward extending at two opposite ends thereof, each of said first and second engaging arms defining an engaging mechanism, a driving arm integrally formed with the second engaging arm and having a greater rigidity than said second engaging arm; wherein
    when assembled, the arcuate pressing portion is received within the channel and the engaging mechanism engages the corresponding projection to sandwich the heat sink and the chip thereunder tightly between the pressing portion of the clip and the socket; when disassembled, a downward force with a successive outward force is applied to the driving arm to have the associated engaging mechanism can be disengaged from the corresponding projection.

* * * * *